(12) United States Patent
Kojima et al.

(10) Patent No.: US 12,289,048 B2
(45) Date of Patent: Apr. 29, 2025

(54) SEMICONDUCTOR MODULE

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Ryota Kojima, Nisshin (JP); Akihiro Yamaguchi, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 482 days.

(21) Appl. No.: 17/717,426

(22) Filed: Apr. 11, 2022

(65) Prior Publication Data
US 2022/0344286 A1    Oct. 27, 2022

(30) Foreign Application Priority Data
Apr. 23, 2021   (JP) ................. 2021-073508

(51) Int. Cl.
*H01L 23/00*   (2006.01)
*H01L 23/498*   (2006.01)
(Continued)

(52) U.S. Cl.
CPC ............. *H02M 1/44* (2013.01); *H02M 3/003* (2021.05); *H01L 2224/32225* (2013.01); *H01L 2924/13055* (2013.01); *H01L 2924/19041* (2013.01)

(58) Field of Classification Search
CPC ................. H02M 1/44; H02M 3/003; H01L 2224/32225; H01L 2924/13055; H01L 2924/19041
(Continued)

(56) References Cited

U.S. PATENT DOCUMENTS 6,078,501 A * 6/2000 Catrambone ......... H02M 7/003
                                                          174/50.56
6,373,705 B1 * 4/2002 Koelle .................... H01L 23/36
                                                           174/16.3
(Continued)

FOREIGN PATENT DOCUMENTS

| JP | 2015-089300 A | 5/2015 |
| JP | 2017-079268 A | 4/2017 |
| JP | 2021-015964 A | 2/2021 |

*Primary Examiner* — Anatoly Vortman
(74) *Attorney, Agent, or Firm* — Posz Law Group, PLC

(57) ABSTRACT

A semiconductor module includes a substrate, a semiconductor package disposed to the substrate, a housing to which the substrate is fixed, and a Y capacitor. A front-surface wiring in the substrate includes a front-surface ground wiring electrically connected to the housing, and a front-surface main wiring connected to a rear-surface wiring that is connected to the semiconductor package. The Y capacitor is disposed on a front surface of the substrate at a position facing the semiconductor package and between the front-surface ground wiring and the front-surface main wiring. The semiconductor package and the Y capacitor are disposed in such a manner that a direction of electric current flowing in the semiconductor package and a direction of electric current flowing in the Y capacitor are opposite to each other.

12 Claims, 9 Drawing Sheets

(51) Int. Cl.
*H01L 23/64* (2006.01)
*H02M 1/44* (2007.01)
*H02M 3/00* (2006.01)

(58) Field of Classification Search
USPC .......................................................... 361/715
See application file for complete search history.

(56) References Cited

U.S. PATENT DOCUMENTS

| | | | | |
|---|---|---|---|---|
| 6,441,520 B1* | 8/2002 | Grant | ...................... | H01L 25/16 |
| | | | | 361/709 |
| 7,279,963 B2* | 10/2007 | Passe | ...................... | H01L 24/49 |
| | | | | 327/437 |
| 7,508,668 B2* | 3/2009 | Harada | ................. | H01L 23/473 |
| | | | | 361/689 |
| 7,957,135 B2* | 6/2011 | Ohkouchi | ............... | H01L 25/18 |
| | | | | 165/185 |
| 8,184,439 B2* | 5/2012 | Baek | ................. | H05K 7/20472 |
| | | | | 257/713 |
| 8,520,386 B2* | 8/2013 | Bott | ...................... | H01L 25/072 |
| | | | | 165/80.4 |
| 8,749,977 B2* | 6/2014 | Asada | ............... | H01L 23/49568 |
| | | | | 361/717 |
| 8,796,816 B2* | 8/2014 | Hayashi | ............ | H01L 23/49575 |
| | | | | 257/532 |
| 8,933,533 B2* | 1/2015 | Mauder | ................ | H01L 29/7786 |
| | | | | 257/E31.049 |
| 8,988,861 B2* | 3/2015 | Yokota | .................. | H02M 7/003 |
| | | | | 361/717 |
| 2001/0048148 A1* | 12/2001 | Koyama | ................. | H01L 24/49 |
| | | | | 257/E23.044 |
| 2003/0006434 A1* | 1/2003 | Kawafuji | .......... | H01L 23/49575 |
| | | | | 257/E23.044 |
| 2004/0056341 A1* | 3/2004 | Endo | ....................... | H01L 23/50 |
| | | | | 257/E23.079 |
| 2011/0291236 A1 | 12/2011 | Hayashi et al. | | |
| 2012/0087095 A1* | 4/2012 | Tokuyama | ............ | H01L 23/467 |
| | | | | 361/720 |
| 2012/0106220 A1* | 5/2012 | Yamaguchi | ............ | H05K 7/209 |
| | | | | 363/131 |
| 2014/0009189 A1* | 1/2014 | Mauder | ............. | H01L 29/42316 |
| | | | | 327/109 |
| 2017/0287853 A1* | 10/2017 | Kim | ................... | H01L 23/3128 |
| 2018/0226383 A1* | 8/2018 | Yamaguchi | ............ | H01L 24/00 |
| 2022/0130799 A1* | 4/2022 | Jang | ....................... | H01L 24/08 |
| 2022/0139880 A1* | 5/2022 | Lee | ..................... | H01L 25/0657 |
| | | | | 257/621 |

\* cited by examiner

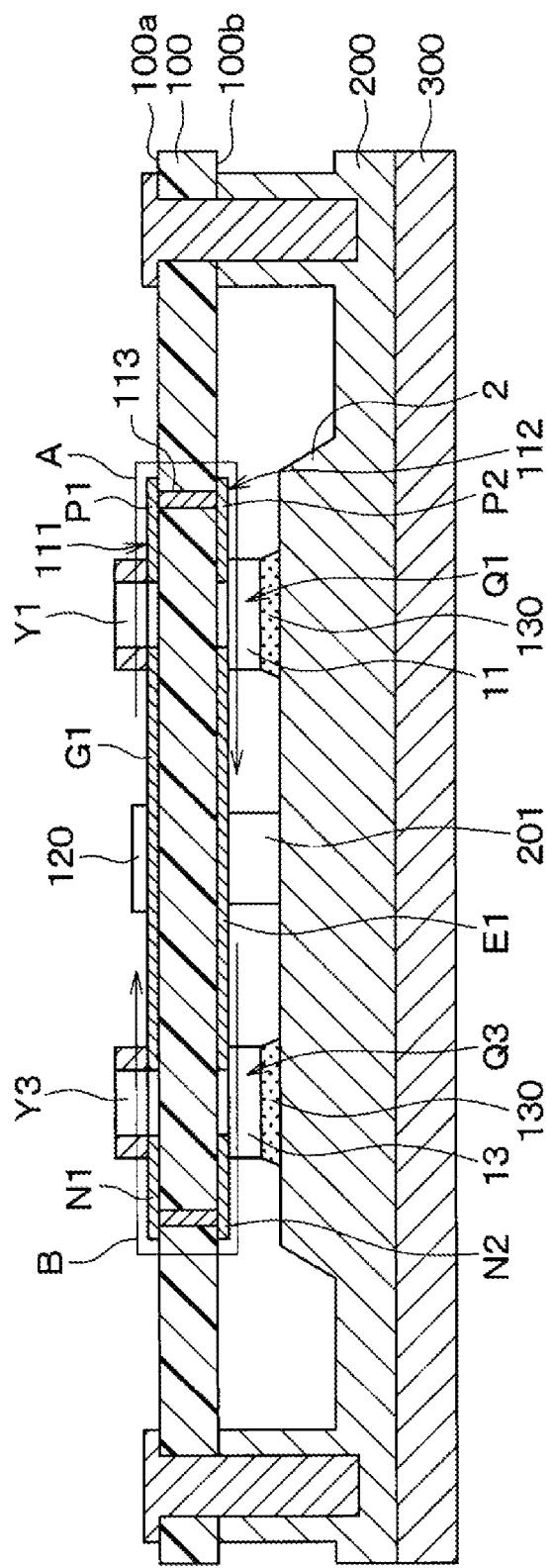

SEMICONDUCTOR MODULE

CROSS REFERENCE TO RELATED APPLICATION

The present application claims the benefit of priority from Japanese Patent Application No. 2021-073508 filed on Apr. 23, 2021. The entire disclosure of the above application is incorporated herein by reference.

TECHNICAL FIELD

The present disclosure relates to a semiconductor module.

BACKGROUND

Conventionally, there has been proposed a semiconductor module in which a semiconductor package having a semiconductor chip is mounted on a substrate.

SUMMARY

The present disclosure provides a semiconductor module including a substrate, a semiconductor package disposed to the substrate, a housing to which the substrate is fixed, and a Y capacitor. A front-surface wiring in the substrate includes a front-surface ground wiring electrically connected to the housing, and a front-surface main wiring connected to a rear-surface wiring that is connected to the semiconductor package. The Y capacitor is disposed on a front surface of the substrate at a position facing the semiconductor package and between the front-surface ground wiring and the front-surface main wiring. The semiconductor package and the Y capacitor are disposed in such a manner that a direction of electric current flowing in the semiconductor package and a direction of electric current flowing in the Y capacitor are opposite to each other.

BRIEF DESCRIPTION OF DRAWINGS

Objects, features and advantages of the present disclosure will become apparent from the following detailed description made with reference to the accompanying drawings. In the drawings:

FIG. 2 is a cross-sectional view of a semiconductor module according to the first embodiment;

DETAILED DESCRIPTION

Figure 1:
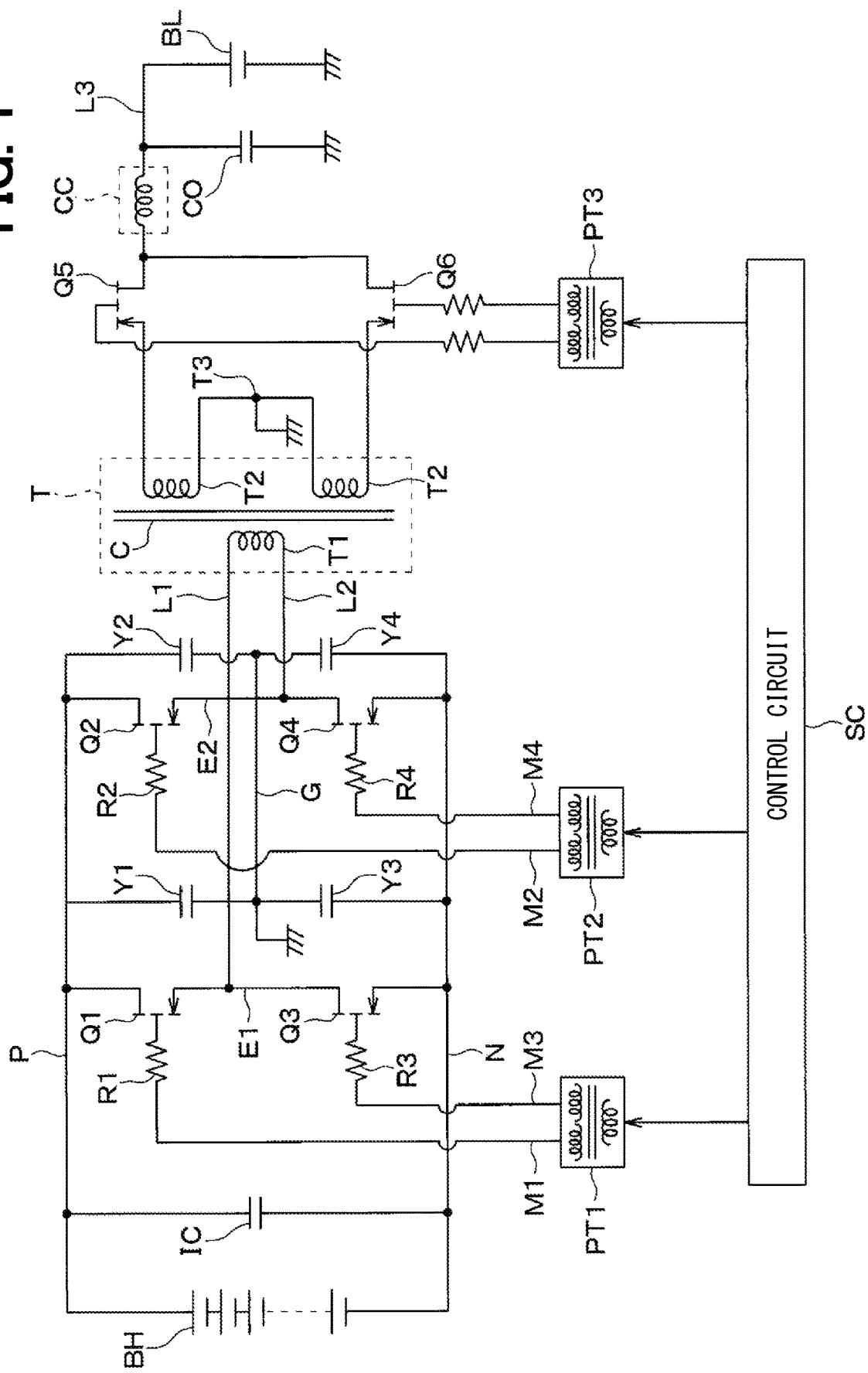
FIG. 1 is a circuit diagram of a power conversion device according to a first embodiment.

A semiconductor module according to a related art includes a substrate and a semiconductor package. The semiconductor package includes a semiconductor chip and is mounted on a substrate. In the semiconductor module, an opening portion is provided in a printed circuit board as a substrate, a metal plate is disposed in the opening portion, and a semiconductor package is disposed so as to be thermally connected to the metal plate. The semiconductor chip includes a semiconductor element such as a transistor. In the semiconductor module, the metal plate is connected to a housing so as to ensure heat dissipation.

In the semiconductor module described above, it is also desired to suppress the influence of noise.

A semiconductor module according to an aspect of the present disclosure includes a substrate, a semiconductor package, a housing and a Y capacitor. The substrate has a front surface, a rear surface opposite to the front surface, a front-surface wiring disposed on the front surface, and a rear-surface wiring disposed on the rear surface. The semiconductor package includes a semiconductor chip and a pad electrically connected to the semiconductor chip. The semiconductor chip includes a switching element. The semiconductor package is disposed to the substrate in a state where the pad is connected to the rear-surface wiring. The substrate is fixed to the housing in a state where the semiconductor package is thermally connected to the housing. The front-surface wiring includes a front-surface ground wiring electrically connected to the housing, and a front-surface main wiring connected to the rear-surface wiring that is connected to the at least one semiconductor package. The Y capacitor is disposed on the front surface of the substrate at a position facing the semiconductor package and between the front-surface ground wiring and the front-surface main wiring. The semiconductor package and the Y capacitor are disposed in such a manner that a direction of electric current flowing in the semiconductor package and a direction of electric current flowing in the Y capacitor are opposite to each other.

According to the above-described configuration, since the Y capacitor is disposed, the influence of common mode noise can be reduced. Further, the semiconductor package and the Y capacitor facing each other are disposed in such a manner that electric currents flow in the opposite directions. Therefore, magnetic fields generated by the flowing currents can be canceled out by each other, and since the parasitic inductance is reduced, the switching surge can be reduced and the generation of noise can be suppressed.

Embodiments of the present disclosure will be described with reference to the drawings. In the following embodiments, the same or equivalent parts are denoted by the same reference numerals.

First Embodiment

A semiconductor module according to a first embodiment will be described with reference to the drawings. The semiconductor module of the present embodiment is suitable for being used to configure a DC-DC converter that converts a direct current into a direct current having a different voltage. For example, the semiconductor module is suitable for being used to configure a DC-DC converter mounted on an electric vehicle.

First, a circuit configuration of a power conversion device to which the semiconductor module of the present embodiment is applied will be described with reference to FIG. 1. The present embodiment will describe an example in which the power conversion device converts a direct current high voltage from a high voltage battery BH into a low voltage to charge an auxiliary battery BL. The auxiliary battery BL is, for example, a battery for an in-vehicle device used for audio or the like in a case where the power conversion device is mounted on a vehicle.

The power conversion device according to the present embodiment includes four primary-side transistors Q1 to Q4 as primary-side semiconductor components that convert the high direct current voltage into a high frequency alternating current voltage, and four Y capacitors Y1 to Y4. The power conversion device further includes a main transformer T as a magnetic component that steps down the alternating current voltage. Further, the power conversion device includes secondary-side transistors Q5 and Q6 as secondary-side semiconductor components that rectify the stepped down alternating current voltage, and a choke coil CC and a smoothing capacitor CO as magnetic components that smooth the rectified direct current voltage. In FIG. 1, one secondary-side transistors Q5 and one secondary-side transistor Q6 are shown, but in reality, two secondary-side transistors Q5 are disposed in parallel and two secondary-side transistors Q6 are disposed in parallel.

The primary-side transistors Q1 to Q4 are formed of, for example, a gallium nitride (hereinafter, simply referred to as GaN)-based semiconductor having a horizontal structure capable of high-speed operation. Further, although not particularly limited, in the present embodiment, the secondary-side transistors Q5 and Q6 are also formed of a GaN-based semiconductor. The primary-side transistors Q1 to Q4 and the secondary-side transistors Q5 and Q6 each have a gate electrode, a source electrode, and a drain electrode.

Hereinafter, when distinguishing the four primary-side transistors Q1 to Q4, they are also referred to as first to fourth transistors Q1 to Q4. Further, hereinafter, when distinguishing the four Y capacitors Y1 to Y4, they are also referred to as first to fourth Y capacitors Y1 to Y4. In the present embodiment, the first to fourth transistors Q1 to Q4 correspond to switching elements. Each of the first to fourth Y capacitors Y1 to Y4 includes multiple Y capacitors disposed in parallel as described in detail later.

First, the configuration of the primary side in the power conversion device will be described. The first to fourth transistors Q1 to Q4 are disposed between a first main wiring P connected to a positive electrode terminal of the high voltage battery BH and a second main wiring N connected to a negative electrode terminal of the high voltage battery BH. Specifically, the first to fourth transistors Q1 to Q4 are disposed so as to form two legs between the first main wiring P and the second main wiring N. More specifically, the first transistor Q1 and the third transistor Q3 are connected and disposed in series via a first electrode wiring E1, and the second transistor Q2 and the fourth transistor Q4 are connected and disposed in series via a second electrode wiring E2. In the first and third transistors Q1 and Q3, the drain electrode of the first transistor Q1 constituting an upper arm element of the leg is connected to the first main wiring P, and the source of the third transistor Q3 constituting an lower arm element of the leg is connected to the second main wiring N. In the second and fourth transistors Q2 and Q4, the drain electrode of the second transistor Q2 constituting an upper arm element of the leg is connected to the first main wiring P, and the source of the fourth transistor Q4 constituting an lower arm element of the leg is connected to the second main wiring N. In the first to fourth transistors Q1 to Q4, the first transistor Q1 and the third transistor Q3 connected in series and the second transistor Q2 and the fourth transistor Q4 connected in series are disposed in parallel.

The gate electrodes of the first and third transistors Q1 and Q3 are connected to a first pulse transformer circuit PT1 via first and third adjustment resistors R1 and R3 and first and third gate connection wirings M1 and M3. The gate electrodes of the second and fourth transistors Q2 and Q4 are connected to a second pulse transformer circuit PT2 via second and fourth adjustment resistors R2 and R4 and second and fourth gate connection wirings M2 and M4.

The first and second pulse transformer circuits PT1 and PT2 are connected to a control circuit SC, and adjust gate voltages applied to the gate electrodes of the first to fourth transistors Q1 to Q4 based on control signals from the control circuit SC. Although omitted in FIG. 1, as shown in FIG. 3B described later, the first and second pulse transformer circuits PT1 and PT2 are also connected to the source electrodes of the first to fourth transistors Q1 to Q4.

Between the source electrode of the first transistor Q1 and the drain electrode of the third transistor Q3, a first output wiring L1 connected to the first electrode wiring E1 is disposed. Between the source electrode of the second transistor Q2 and the drain electrode of the fourth transistor Q4, a second output wiring L2 connected to the second electrode wiring E2 is disposed. The first output wiring L1 and the second output wiring L2 are connected to a primary winding T1 described later.

In the first to fourth Y capacitors Y1 to Y4, the first Y capacitor Y1 and the third Y capacitor Y3 are connected and disposed in series between the first main wiring P and the second main wiring N, and the second Y capacitor Y2 and the fourth Y capacitor Y4 are connected and disposed in series. A connection point between the first Y capacitor Y1 and the third Y capacitor Y3 and a connection point between the second Y capacitor Y2 and the fourth Y capacitor Y4 are connected to the ground via a ground wiring G. In the present embodiment, as will be described later, the ground wiring G is electrically connected to a housing 200 to be a ground potential.

Further, input capacitors IC are disposed between the high voltage battery BH and the first to fourth transistors Q1 to Q4 and the first to fourth Y capacitors Y1 to Y4.

The above is the configuration on the primary side of the power conversion device. The main transformer T includes the primary winding T1, a secondary winding T2, and a core C. The primary winding T1 has one end connected to the first output wiring L1 and the other end connected to the second output wiring L2.

Next, the configuration of the secondary side in the power conversion device will be described. The secondary winding T2 has an intermediate tap T3, and the intermediate tap T3 is connected to the ground. Further, the secondary-side transistor Q5 is disposed between one end side of the secondary winding T2 and an external output line L3, and the secondary side transistor Q6 is disposed between the other end side of the secondary winding T2 and the external output line L3. Each gate electrode of the secondary-side transistors Q5 and Q6 is connected to a third pulse transformer circuit PT3 via fifth and sixth adjustment resistors R5 and R6, similarly to the gate electrodes of the first to fourth transistors Q1 to Q4. The third pulse transformer circuit PT3 is connected to the control circuit SC, and adjusts gate voltages applied to the gate electrodes of the fifth and sixth transistors Q5 and Q6 based on the control signals from the control circuit SC.

Further, on the external output line L3, the choke coil CC is disposed between the auxiliary battery BL and a connection point between the secondary side transistor Q5 and the secondary side transistor Q6. Further, the smoothing capacitor CO connected to the ground is disposed between the choke coil CC and the auxiliary battery BL.

The above is the configuration of the power conversion device according to the present embodiment. In the power conversion device described above, the high voltage of the high voltage battery BH is stepped down to a desired voltage by appropriately adjusting a ratio of number of turns of the primary winding T1 and the secondary winding T2 and controlling on/off states of the first to fourth transistors Q1 to Q4 to adjust a primary current that flows through the primary winding T1, and the stepped down voltage is applied to the auxiliary battery BL.

Next, the configuration of the semiconductor module constituting the power conversion device will be described with reference to FIGS. 2, 3A, and 3B. The printed circuit board 100 in FIG. 2 corresponds to a cross-sectional view taken along the line II-II in FIGS. 3A and 3B.

The semiconductor module of the present embodiment is configured by mounting each part constituting the power conversion device such as the first to fourth transistors Q1 to Q4 and the first to fourth Y capacitors Y1 to Y4 on the printed circuit board 100. The semiconductor module is configured by fixing the printed circuit board 100 to the housing 200.

Hereinafter, the arrangement relationship of the first to fourth semiconductor packages 11 to 14 including the first to fourth transistors Q1 to Q4 and the first to fourth Y capacitors Y1 to Y4 will be mainly described. The main transformer T and the constituent members on the secondary side of the power conversion device are appropriately formed and disposed in a cross section different from the cross section shown in FIG. 2. Further, in the semiconductor module according to the present embodiment, as shown in FIG. 2, a cooling member 300 for improving heat dissipation is disposed on the opposite side of the housing 200 from the printed circuit board 100. The cooling member 300 is configured by, for example, flowing cooling water or the like through a pipe.

Figure 4A:
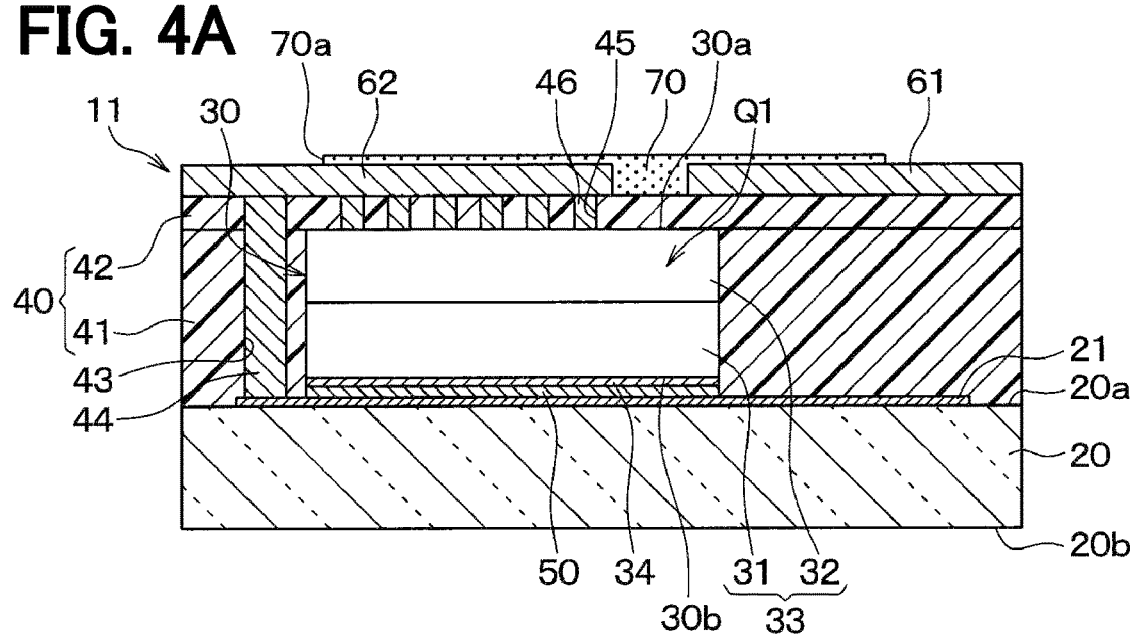
FIG. 4A is a cross-sectional view of a semiconductor package.
Figure 4B:
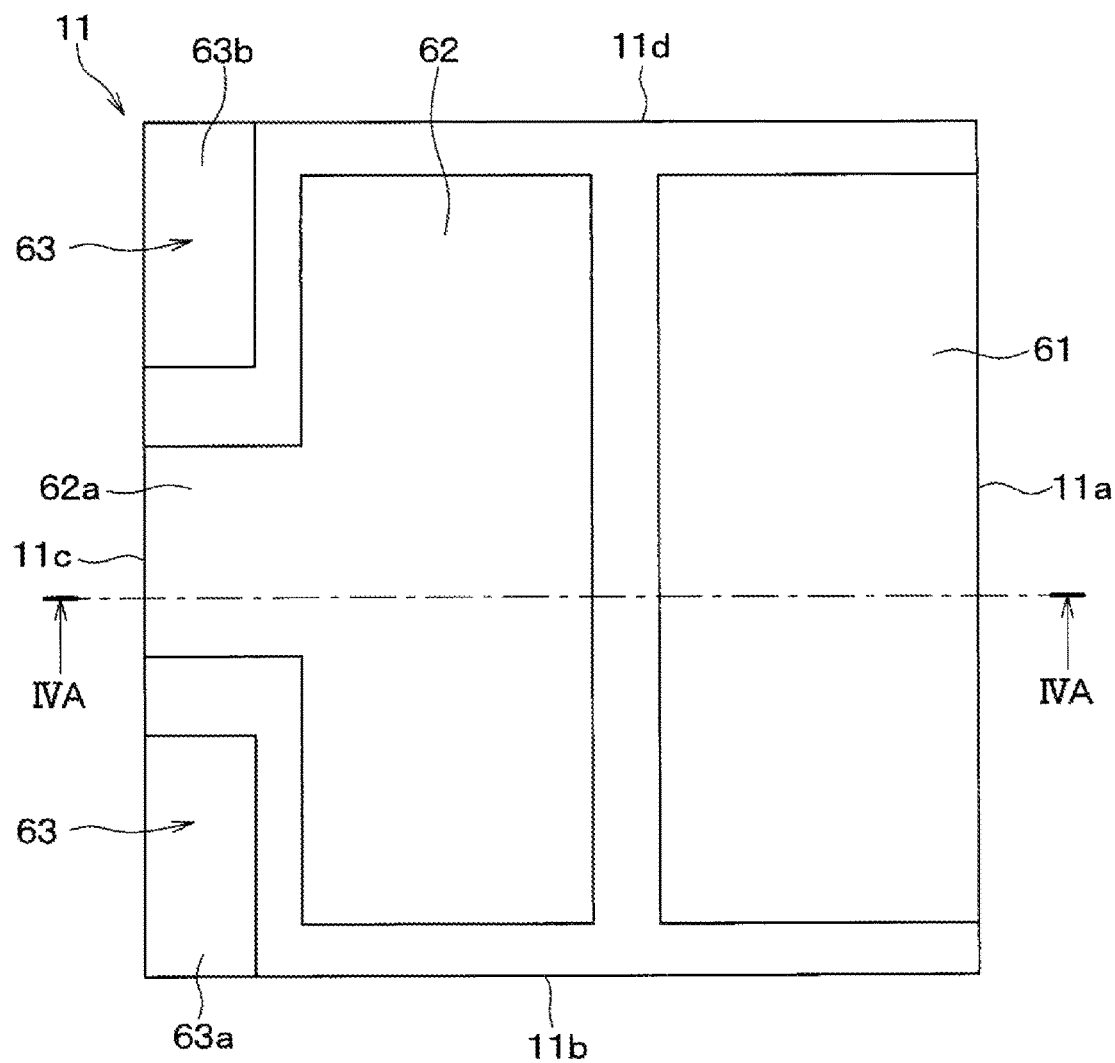
FIG. 4B is a plan view of the semiconductor package.

First, the configuration of the first semiconductor package 11 including the first transistor Q1 of the present embodiment will be described with reference to FIGS. 4A and 4B. The configurations of the second to fourth semiconductor packages 12 to 14 including the second to fourth transistors Q2 to Q4 are the same as the configuration of the first semiconductor package 11. FIG. 4A corresponds to a cross-sectional view taken along the line IVA-IVA in FIG. 4B.

The first semiconductor package 11 is configured to include an insulating heat dissipation substrate 20, a semiconductor chip 30, a sealing member 40, pads 61 to 63, and the like.

The insulating heat dissipation substrate 20 is made of silicon nitride (SiN), aluminum nitride (AlN), or the like, and has a plate shape having a front surface 20a and a rear surface 20b opposite to the front surface 20a. The insulating heat dissipation substrate 20 is formed with a connection wiring 21 made of copper or the like on the front surface 20a. The thickness of the connection wiring 21 is about 10 μm to 100 μm.

In the present embodiment, the semiconductor chip 30 is configured by using a semiconductor substrate 33 in which a semiconductor layer 32 containing gallium nitride is laminated on a silicon substrate 31 made of silicon. In other words, the semiconductor chip 30 is configured by using the semiconductor substrate 33 that is so-called GaN-on-Si. The semiconductor chip 30 has the semiconductor layer 32 on a front surface 20a and has the silicon substrate 31 on a rear surface 20b.

The semiconductor layer 32 containing gallium nitride of the present embodiment is configured by laminating an epitaxial layer such as a gallium nitride (GaN) layer and an aluminum gallium nitride (AlGaN) layer. In the present embodiment, a two-dimensional electron gas (that is, 2 DEG) is provided at an interface between the gallium nitride layer and the aluminum gallium nitride layer.

Although not particularly shown, the semiconductor chip 30 is formed with a drain electrode, a source electrode, and a gate electrode in the first transistor Q1 on the front surface 30a. The semiconductor chip 30 of the present embodiment is formed with a high electron mobility transistor as the first transistor Q1 in which the two-dimensional electron gas is used to pass a current between the drain electrode and the source electrode. That is, the semiconductor chip 30 is formed with a horizontal transistor as the first transistor Q1 in which a current flows in a plane direction of the semiconductor substrate 33.

Further, the semiconductor chip 30 is formed with a rear surface electrode 34 on the rear surface 30b. The rear surface electrode 34 is electrically connected to the source electrode in the first transistor Q1, as described in detail later. As a result, the semiconductor chip 30 of the present embodiment is designed to suppress current collapse.

The above is the configuration of the semiconductor chip 30 of the present embodiment. The semiconductor chip 30 is disposed above the connection wiring 21 formed on the insulating heat dissipation substrate 20 with the rear surface electrode 34 facing the insulating heat dissipation substrate 20 via a bonding member 50. At this time, the semiconductor chip 30 is disposed in a state of being insulated from the rear surface 20b of the insulating heat dissipation substrate 20. The bonding member 50 is formed of a conductive member such as a sintered body containing silver tin (AgSn) as a main component. Therefore, the rear surface electrode 34 is electrically connected to the connection wiring 21 via the bonding member 50. The connection wiring 21 is formed so as to protrude from the semiconductor chip 30 in a state where the semiconductor chip 30 is disposed when viewed from the normal direction with respect to the front surface 20a of the insulating heat dissipation substrate 20.

The sealing member 40 is disposed on the insulating heat dissipation substrate 20 so as to be bonded to the insulating heat dissipation substrate 20 while sealing the semiconductor chip 30. However, the sealing member 40 is disposed on the insulating heat dissipation substrate 20 so as to expose the rear surface 20b of the insulating heat dissipation substrate 20. The sealing member 40 of the present embodiment has a side surface sealing member 41 that seals side surfaces of the semiconductor chip 30, and a front surface sealing member 42 that seals the front surface 30a of the semiconductor chip 30. Each of the side surface sealing member 41 and the front surface sealing member 42 is formed of a resin member such as liquid crystal polymer and epoxy resin.

On the sealing member 40, a drain pad 61, a source pad 62, and a gate pad 63 are formed. In the present embodiment, the first semiconductor package 11 has a substantially rectangular shape having two sets of opposite first to fourth sides 11a to 11d when viewed from the normal direction with respect to the front surface 20a of the insulating heat dissipation substrate 20. The drain pad 61, the source pad 62, and the gate pad 63 are disposed as follows when viewed from the normal direction with respect to the front surface 20a of the insulating heat dissipation substrate 20.

That is, the drain pad 61 has a planar rectangular shape extending in a direction from the second side 11b toward the fourth side 11d, and is disposed close to the first side 11a. The source pad 62 has a planar rectangular shape extending in the direction from the second side 11b toward the fourth side 11d, and is disposed close to the third side 11c. The source pad 62 of the present embodiment is configured to have a protruding portion 62a that protrudes from a portion having a planar rectangular shape toward a center of the third side 11c.

In the present embodiment, the gate pad 63 has a first gate pad 63a and a second gate pad 63b. The first gate pad 63a is disposed at a corner where the second side 11b and the third side 11c are connected, and the second gate pad 63b is disposed at a corner where the third side 11c and the fourth side 11d are connected. More specifically, the first gate pad 63a and the second gate pad 63b are disposed so as to sandwich the protruding portion 62a of the source pad 62. In FIG. 4B, a protective film 70, which will be described later, is omitted. Further, in the present embodiment, the drain pad 61 and the source pad 62 correspond to a first pad and a second pad, respectively.

The sealing member 40 has a first through hole 43 that penetrates the side surface sealing member 41 and the front surface sealing member 42 along the side surface of the semiconductor chip 30 so as to expose the connection wiring 21. In the first through hole 43, a first through electrode 44 that electrically connects the connection wiring 21 and the source pad 62 is disposed.

The front surface sealing member 42 has a second through hole 45 for exposing the source electrode. In the second through hole 45, a second through electrode 46 that electrically connects the source electrode and the source pad 62 is disposed. As a result, in the first semiconductor package 11, the source electrode is electrically connected to the rear surface electrode 34 via the second through electrode 46, the source pad 62, and the first through electrode 44.

Although not particularly shown, in a cross section different from the cross section in FIG. 4A, the front surface sealing member 42 has a through hole for exposing the drain electrode. In the through hole, a through electrode that electrically connects the drain electrode and the drain pad 61 is disposed. Similarly, although not particularly shown, in a cross section different from the cross section in FIG. 4A, the front surface sealing member 42 has a through hole for exposing the gate electrode. In the through hole, a through electrode that electrically connects the gate electrode and the gate pad 63 is disposed. In the present embodiment, as described above, the first gate pad 63a and the second gate pad 63b are formed as the gate pads 63. The first gate pad 63a and the second gate pad 63b are each electrically connected to the gate electrode via the through electrodes.

Further, on the front surface 30a of the first semiconductor package 11, a protective film 70 having a contact hole 70a for exposing predetermined portions of the drain pad 61, the source pad 62, and the gate pad 63 is disposed.

The above is the configuration of the first semiconductor package 11 in the present embodiment. The second to fourth semiconductor packages 11 to 14 have the same configuration as the first semiconductor package 11 as described above. When the first to fourth semiconductor packages 11 to 14 are disposed on the printed circuit board 100, in the gate pads 63, either one of the first gate pad 63a and the second gate pad 63b has to be connected to a wiring of the printed circuit board 100. Therefore, the first to fourth semiconductor packages 11 to 14 can have the same configuration, and the degree of freedom of wiring with the printed circuit board 100 can be improved.

As shown in FIG. 2, the printed circuit board 100 has a front surface 100a and a rear surface 100b opposite to the front surface 100a. In the printed circuit board 100, a front-surface wiring 111 is formed on the front surface 100a and a rear-surface wiring 112 is formed on the rear surface 100b. Although not particularly shown, the printed circuit board 100 has an inner layer wiring formed in an inner layer. The printed circuit board 100 has through-hole electrodes 113 at predetermined positions to electrically connect the front-surface wiring 111, the rear-surface wiring 112, and the inner layer wiring.

Figure 3A:
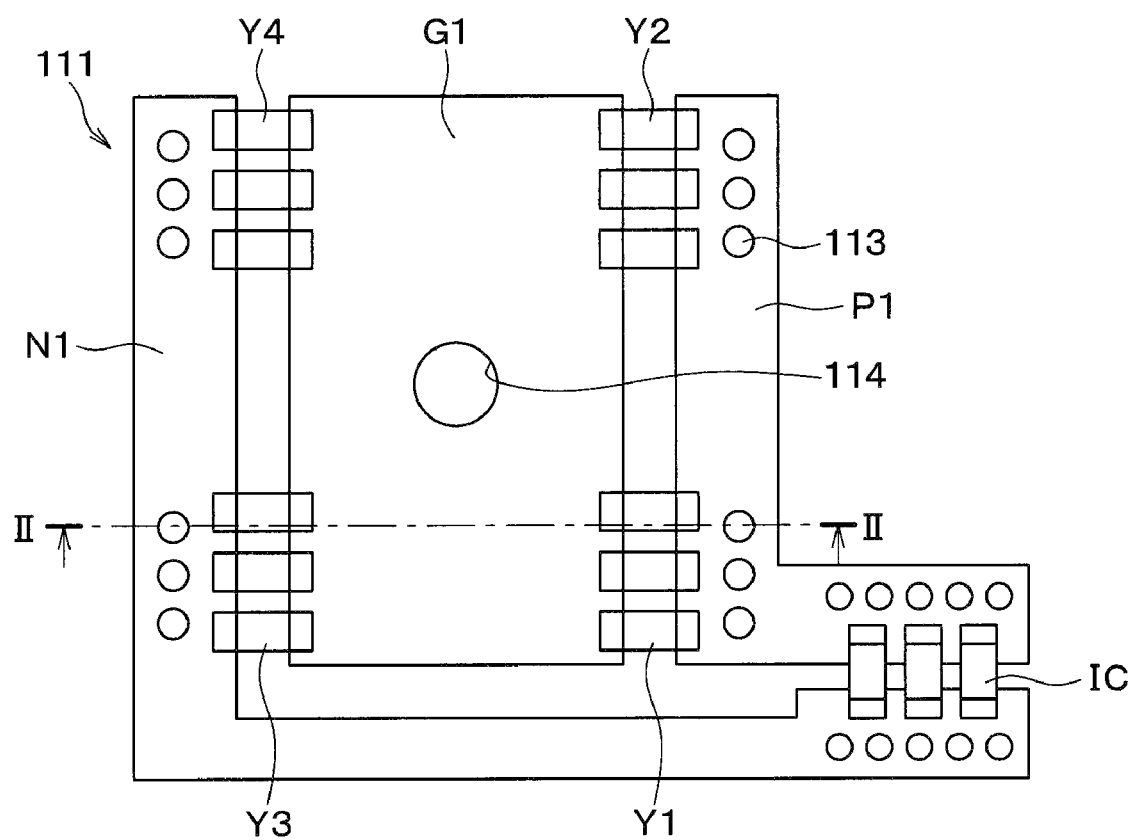
FIG. 3A is a schematic plan view of the vicinity of an insertion hole on a front surface side of a printed circuit board.
Figure 3B:
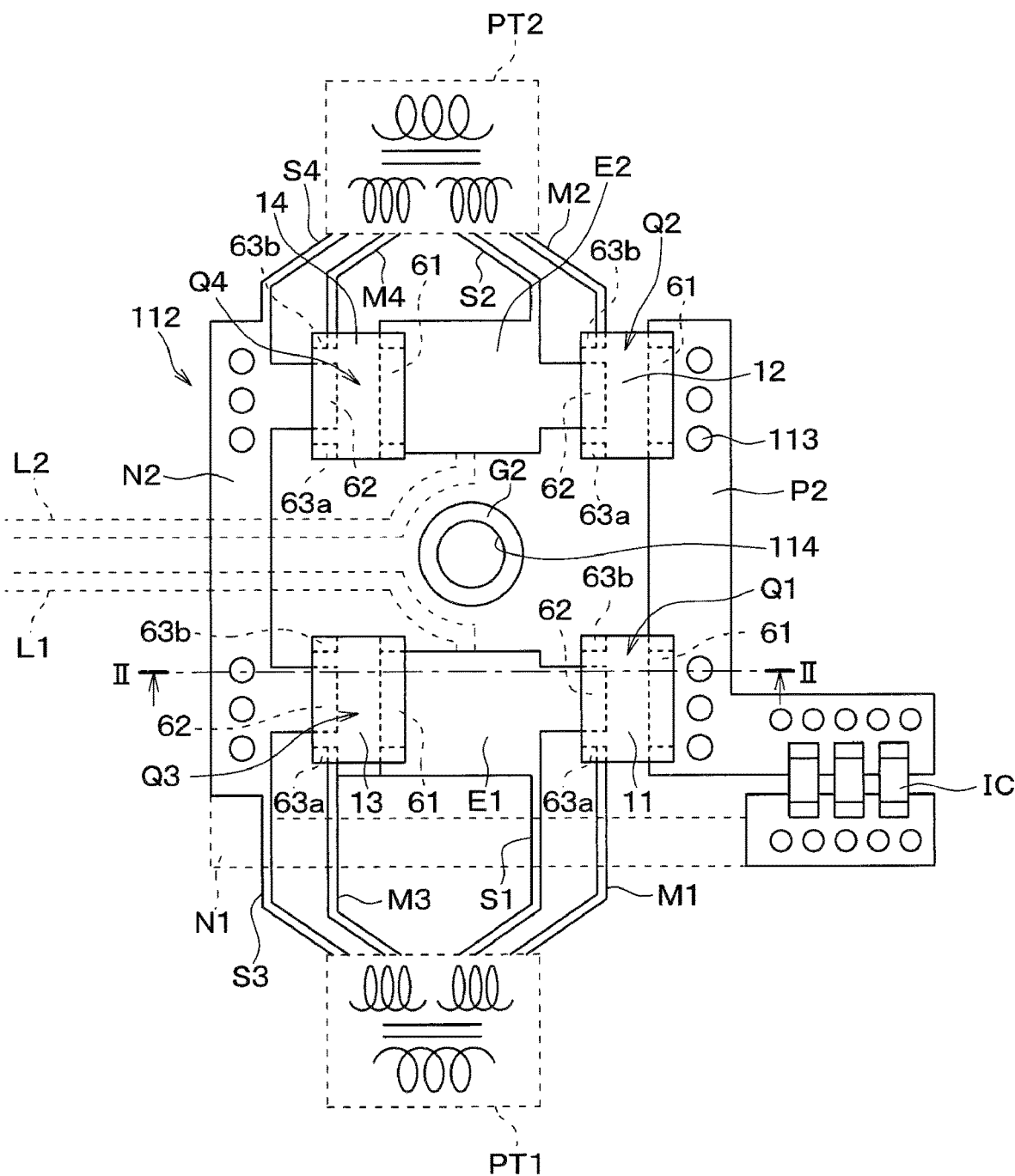
FIG. 3B is a schematic plan view of the vicinity of the insertion hole on a rear surface side of the printed circuit board.

In the printed circuit board 100 of the present embodiment, as shown in FIGS. 2 and 3A, a front-surface ground wiring G1, a front-surface first main wiring P1, and a front-surface second main wiring N1 are formed as the front-surface wiring 111. Specifically, the front-surface ground wiring G1 is disposed along one direction in a plane direction of the printed circuit board 100. The front-surface first main wiring P1 and the front-surface second main wiring N1 are disposed along the extending direction of the front-surface ground wiring G1 and are disposed so as to sandwich the front-surface ground wiring G1. The front-surface first main wiring P1 of the present embodiment is bent at one end in the extending direction. Similarly, the front-surface second main wiring N1 of the present embodiment is bent at one end in the extending direction, and the bent portion is extended to a portion facing the bent portion of the front-surface first main wiring P1.

Further, the printed circuit board 100 has an insertion hole 114 that penetrates the printed circuit board 100. In the insertion hole 114, a fastening member 120 for fastening the printed circuit board 100 to the housing 200 is inserted. Specifically, the insertion hole 114 is formed so as to penetrate the front surface ground wiring G1. Although not shown in particular, a metal film is disposed on a wall surface of the insertion hole 114. In FIG. 3A and the like, the fastening member 120 is omitted.

As shown in FIGS. 2 and 3B, on the rear surface 100b of the printed circuit board 100, a rear-surface first main wiring P2, a rear-surface second main wiring N2, the first electrode wiring E1, the second electrode wiring E2, first to fourth gate connection wirings M1 to M4, and first to fourth source connection wirings S1 to S4 are formed as the rear-surface wiring 112. Further, on the rear surface 100b of the printed circuit board 100, a rear-surface ground wiring G2 is formed around the insertion hole 114 as the rear-surface wiring 112. The front surface ground wiring G1 and the rear surface ground wiring G2 are electrically connected via the fastening member 120 disposed in the insertion hole 114 and the metal film formed in the insertion hole 114. As a result, the ground wiring G is configured.

The rear-surface first main wiring P2 is formed at a position facing the front-surface first main wiring P1. The printed circuit board 100 has the through-hole electrodes 113 that electrically connect the front-surface first main wiring P1 and the rear-surface first main wiring P2. As a result, the first main wiring P is configured.

The rear-surface second main wiring N2 is formed at a position facing the front-surface second main wiring N1. The printed circuit board 100 has the through-hole electrodes 113 that electrically connect the front-surface second main wiring N1 and the rear-surface second main wiring N2. As a result, the second main wiring N is configured.

The first electrode wiring E1 is disposed between the rear-surface first main wiring P2 and the rear-surface second main wiring N2. The second electrode wiring E2 is disposed between the rear-surface first main wiring P2 and the rear-surface second main wiring N2, and is disposed opposite to the first electrode wiring E1 with the insertion hole 114 interposed therebetween. That is, the first electrode wiring E1 and the second electrode wiring E2 are disposed so as to sandwich the insertion hole 114.

The first to fourth semiconductor packages 11 to 14 are disposed to the rear surface 100b of the printed circuit board 100 via a conductive member such as solder. The pads 61, 62, 63a, and 63b in the first to fourth semiconductor packages 11 to 14 in FIG. 3B show portions exposed from the protective film 70.

Specifically, the first semiconductor package 11 (that is, the first transistor Q1) is disposed in such a manner that the source pad 62 is connected to the first electrode wiring E1 and the drain pad 61 is connected to the rear-surface first main wiring P2. The second semiconductor package 12 (that is, the second transistor Q2) is disposed in such a manner that the source pad 62 is connected to the second electrode wiring E2 and the drain pad 61 is connected to the rear-surface first main wiring P2. The third semiconductor package 13 (third transistor Q3) is disposed in such a manner that the source pad 62 is connected to the rear-surface second main wiring N2 and the drain pad 61 is connected to the first electrode wiring E1. The fourth semiconductor package 14 (that is, the fourth transistor Q4) is disposed in such a manner that the source pad 62 is connected to the rear-surface second main wiring N2 and the drain pad 61 is connected to the second electrode wiring E2.

Further, on the printed circuit board 100, the first output wiring L1 is formed so as to be connected to the first electrode wiring E1, and the second output wiring L2 is formed so as to be connected to the second electrode wiring E2. In the present embodiment, the first output wiring L1 is formed of the inner layer wiring of the printed circuit board 100, and is electrically connected to the first electrode wiring E1 via a through-hole electrode formed inside the printed circuit board 100. Similarly, the second output wiring L2 is formed of the inner layer wiring of the printed circuit board 100, and is electrically connected to the second electrode wiring E2 via a through-hole electrode formed inside the printed circuit board 100.

Further, the first output wiring L1 is drawn out from a portion of the first electrode wiring E1 close to the insertion hole 114 when viewed from the normal direction with respect to one surface 100a of the printed circuit board 100 (hereinafter, also simply referred to as the normal direction). The second output wiring L2 is drawn out from a portion of the second electrode wiring E2 close to the insertion hole 114 when viewed from the normal direction.

The first to fourth gate connection wirings M1 to M4 are disposed so as to be connected to the gate pads 63 of the respective semiconductor packages 11 to 14. Specifically, each of the first and third semiconductor packages 11 and 13 is disposed in such a manner that the second gate pad 63b is disposed close to the insertion hole 114, and the first gate pad 63a is disposed opposite to the insertion hole 114. Further, each of the second and fourth semiconductor packages 12 and 14 is disposed in such a manner that the first gate pad 63a is disposed close to the insertion hole 114, and the second gate pad 63b is disposed opposite to the insertion hole 114.

The first and third gate connection wirings M1 and M3 are drawn out so as to extend in a direction opposite to the insertion hole 114 with the first electrode wiring E1 interposed therebetween. That is, the first and third gate connection wirings M1 and M3 are drawn out in the direction opposite to the first output wiring L1 when viewed from the normal direction. Further, the second and fourth gate connection wirings M2 and M4 are drawn out so as to extend in a direction opposite to the insertion hole 114 with the second electrode wiring E2 interposed therebetween. That is, the second and fourth gate connection wirings M2 and M4 are drawn out so as to extend in the direction opposite to the second output wiring L2 when viewed from the normal direction.

In the present embodiment, since the two gate pads 63a and 63b are provided as described above, the gate connection wirings M1 to M4 can be easily drawn out in the direction opposite to the insertion hole 114 and the first and second output wirings L1 and L2 when viewed from the normal direction. Therefore, the degree of freedom of wiring on the printed circuit board 100 can be improved.

The first source connection wiring S1 is drawn out from the first electrode wiring E1 so as to extend in the direction opposite to the insertion hole 114. The third source connection wiring S3 is drawn out from the rear-surface second main wiring N2 so as to extend in the direction opposite to the insertion hole 114. The second source connection wiring S2 is drawn out from the second electrode wiring E2 so as to extend in the direction opposite to the insertion hole 114. The fourth source connection wiring S4 is drawn out from the rear-surface second main wiring N2 so as to extend in the direction opposite to the insertion hole 114.

Further, in the present embodiment, the first to fourth gate connection wirings M1 to M4 and the first to fourth source connection wirings S1 to S4 are disposed to be orthogonal to the front-surface first main wiring P1 or the rear-surface second main wiring N2 at portions overlapped with the front-surface first main wiring P1 or the rear-surface second main wiring in the normal direction. In the present embodiment, the first and third gate connection wirings M1 and M3 and the first and third source connection wirings S1 and S3 overlap with the front-surface second main wiring N1 in the normal direction. Therefore, the first and third gate connection wirings M1 and M3 and the first and third source connection wirings S1 and S3 are disposed so as to be orthogonal to the front-surface second main wiring N1 in the normal direction.

As shown in FIGS. 2 and 3A, the first to fourth Y capacitors Y1 to Y4 are disposed on the front surface 100a of the printed circuit board 100. Specifically, the first Y capacitor Y1 includes three Y capacitors disposed at positions facing the first semiconductor package 11 so as to connect the front-surface ground wiring G1 and the front-surface first main wiring P1. The second Y capacitor Y2 includes three Y capacitors disposed at positions facing the second semiconductor package 12 so as to connect the front-surface ground wiring G1 and the front-surface first main wiring P1. The third Y capacitor Y3 includes three Y capacitors disposed at positions facing the third semiconductor package 13 so as to connect the front-surface ground wiring G1 and the front-surface second main wiring N1. The fourth Y capacitor Y4 includes three Y capacitors disposed at positions facing the fourth semiconductor package 14 so as to connect the front-surface ground wiring G1 and the front-surface second main wiring N1.

The first to fourth semiconductor packages 11 to 14 and the first to fourth Y capacitors Y1 to Y4 are disposed in such a manner that directions of electric currents flowing through the first to fourth semiconductor packages 11 to 14 are opposite to directions of electric currents flowing through the first to fourth Y capacitors, respectively, as shown by arrows A and B in FIG. 2. In other words, in the printed circuit board 100, the front-surface wiring 111, the rear-surface wiring 112, and the through hole electrodes 113 are configured such that the directions of electric currents flowing through the first to fourth semiconductor packages 11 to 14 are opposite to directions of electric currents flowing through the first to fourth Y capacitors facing to the first to fourth semiconductor packages 11 to 14, respectively.

The first to fourth Y capacitors Y1 to Y4 are formed of chip capacitors such as ceramic capacitors, for example. Further, in the present embodiment, each of the first to fourth Y capacitors Y1 to Y4 includes the three Y capacitors disposed in parallel with each other.

In the present embodiment, the input capacitors IC are disposed on the front surface 100a of the printed circuit board 100 so as to connect the front-surface first main wiring P1 and the front-surface second main wiring N1. Further, the input capacitors IC are disposed on the rear surface 100b of the printed circuit board 100 so as to connect the rear-surface first main wiring P2 and the rear-surface second main wiring N2.

The printed circuit board 100 on which the first to fourth semiconductor packages 11 to 14 and the first to fourth Y capacitors Y1 to Y4 are disposed in this way is fixed to the housing 200 as follows. The printed circuit board 100 is fixed to the housing 200 by inserting the fastening member 120 such as a screw or the like into the insertion hole 114 and fastening the fastening member 120 to the housing 200. Accordingly, the front-surface ground wiring G1 and the rear-surface ground wiring G2 are electrically connected to the housing 200 to be the ground potential.

More specifically, the printed circuit board 100 is fixed to the housing 200 with the rear surface 100b facing the housing 200. Further, the printed circuit board 100 is fixed to the housing 200 in such a manner that the rear surfaces 20b of the insulating heat dissipation substrates 20 in the first to fourth semiconductor packages 11 to 14 are joined to the housing 200 via the heat dissipation members 130. As a result, the heat of the first to fourth semiconductor packages 11 to 14 can be efficiently dissipated to the housing 200. As the heat dissipation members 130, grease or the like having high thermal conductivity can be used. The housing 200 is provided with a protruding portion 201 protruding in the normal direction with respect to the plane direction of the housing 200. Then, the printed circuit board 100 is fixed to the housing 200 in such a manner that the rear-surface ground wiring G2 comes into contact with (that is, is electrically connected to) the protruding portion 201.

The above is the configuration of the semiconductor module constituting the power conversion device in the present embodiment. The main transformer T, the components on the secondary side, and the like are composed of wirings or the like formed on the printed circuit board 100 on a cross section different from the cross section shown in FIG. 2, or are composed of external members or the like.

When the power conversion device is configured using the semiconductor module described above, the primary current flowing through the primary winding T1 is adjusted by turning on and off the first to fourth transistors Q1 to Q4. In the present embodiment, the first to fourth Y capacitors Y1 to Y4 are disposed so as to be connected to the first to fourth transistors Q1 to Q4 and the ground. Therefore, the influence of common mode noise can be reduced.

Further, the first to fourth Y capacitors Y1 to Y4 and the first to fourth semiconductor packages 11 to 14 (that is, the first to fourth transistors Q1 to Q4) are disposed so as to face each other with the printed circuit board 100 interposed therebetween. The first to fourth semiconductor packages 11 to 14 and the first to fourth Y capacitors Y1 to Y4 are disposed in such a manner that the directions of the electric currents flowing through the first to fourth semiconductor packages 11 to 14 are opposite to the directions of the electric currents flowing through the first to fourth Y capacitors, respectively. Therefore, magnetic fields generated by the flowing currents can be canceled out from each other between the first to fourth semiconductor packages 11 to 14 and the Y capacitors Y1 to Y4 facing to each other, the switching surge is reduced by the reduction of the parasitic inductance, and the generation of noise can be suppressed.

According to the present embodiment described above, the first to fourth Y capacitors Y1 to Y4 are disposed between the first to fourth transistors Q1 to Q4 and the ground. Therefore, the influence of common mode noise can be reduced.

Further, in the present embodiment, the first to fourth Y capacitors Y1 to Y4 and the first to fourth semiconductor packages 11 to 14 (that is, the first to fourth transistors Q1 to Q4) are disposed so as to face each other with the printed circuit board 100 interposed therebetween. The first to fourth semiconductor packages 11 to 14 and the first to fourth Y capacitors Y1 to Y4 are disposed in such a manner that the directions of the electric currents flowing through the first to fourth semiconductor packages 11 to 14 are opposite to the directions of the electric currents flowing through the first to fourth Y capacitors, respectively. Therefore, the magnetic fields generated by the flowing currents can be canceled out from each other between the first to fourth semiconductor packages 11 to 14 and the Y capacitors Y1 to Y4 facing to each other, the switching surge is reduced by the reduction of the parasitic inductance, and the generation of noise can be suppressed.

Further, in the present embodiment, the printed circuit board 100 is fixed to the housing 200 in such a manner that the first to fourth semiconductor packages 11 to 14 are thermally connected to the housing 200. Therefore, the heat of the first to fourth semiconductor packages 11 to 14 can be efficiently dissipated to the housing 200.

In the present embodiment, in the first to fourth semiconductor packages 11 to 14, the semiconductor chip 30 and the pads 61 to 63 are electrically connected via the second through electrodes 46. Therefore, for example, as compared with a case where the semiconductor chip 30 and the pads 61 to 63 are connected via bonding wires or the like, the length of the connecting portion can be shortened, and the parasitic inductance can be reduced.

In the present embodiment, the semiconductor chip 30 is configured by forming the lateral switching element that allows an electric current to flow in the plane direction. Therefore, in the first to fourth semiconductor packages 11 to 14, the electric currents flow in the plane direction, and the magnetic field generated by the electric currents flowing through the first to fourth semiconductor packages 11 to 14 and the magnetic fields generated by the electric currents flowing through the first to fourth Y capacitors Y1 to Y4 are easily cancelled out each other.

In the present embodiment, the semiconductor chip 30 is configured using the semiconductor substrate 33 in which the semiconductor layer 32 containing gallium nitride is laminated on the silicon substrate 31. Therefore, a switching element capable of high-speed operation can be configured. Further, since the semiconductor layer 32 containing gallium nitride is laminated on the silicon substrate 31, mass production is easier and the cost is reduced as compared with a case where the semiconductor substrate 33 is composed only of the semiconductor layer 32 containing gallium nitride.

In the present embodiment, each of the first to fourth semiconductor packages 11 to 14 has a configuration in which the semiconductor chip 30 is disposed on the front surface 20a of the insulating heat dissipation substrate 20, and the semiconductor chip 30 is insulated from the rear surface 20b of the insulating heat dissipation substrate 20. Then, in each of the first to fourth semiconductor packages 11 to 14, the rear surface 20b of the insulating heat dissipation substrate 20 is connected to the housing 200 via the heat dissipation member 130. Therefore, even if the heat dissipation member 130 is made thin, the insulation between the housing 200 and the semiconductor chip 30 and the like can be ensured. Further, since the semiconductor chip 30 and the rear surface 20b of the insulating heat dissipation substrate 20 is insulated, the heat dissipation member 130 may be formed of, for example, a conductive member or the like, and the material selectivity can be improved.

In the present embodiment, the heat dissipation member 130 is disposed between the first to fourth semiconductor packages 11 to 14 and the housing 200. Therefore, the heat of the first to fourth semiconductor packages 11 to 14 can be effectively dissipated to the housing 200.

In the present embodiment, each of the first to fourth Y capacitors Y1 includes multiple capacitors connected in parallel. Therefore, the loss caused by the equivalent series resistance (that is, ESR) can be reduced.

In the present embodiment, the first and third gate connection wirings M1 and M3 are drawn out to in the direction opposite to the first output wiring L1 when viewed from the normal direction. The second and fourth gate connection wirings M2 and M4 are drawn out in the direction opposite from the second output wiring L2 when viewed from the normal direction. Therefore, it is possible to suppress the interference between the gate connection wirings M1 to M4 and the output wirings L1 and L2, and it is possible to prevent failure of the transistors Q1 to Q4 due to noise superimposed on each gate voltage. Further, the first to fourth gate connection wirings M1 to M4 are disposed so as to be orthogonal to the front-surface first main wiring P1 or the rea-surface second main wiring N2 at the portions where the first to fourth gate connection wirings M1 to M4 overlap with the front-surface first main wiring P1 or the rea-surface second main wiring N2 in the normal direction. Therefore, it is possible to suppress the interference between the gate connection wirings M1 to M4 and the front-surface main wirings P1 and N1, and it is possible to suppress failure of the transistors Q1 to Q4 due to the superimposition of noise on each gate voltage.

In the present embodiment, the ground wiring G is electrically connected to the housing 200 via the fastening member 120. Therefore, it is possible to electrically connect the ground wiring G to the housing 200 while fixing the printed circuit board 100 to the housing 200, and to reduce the size as compared with a case where the fastening member 120 is disposed in a portion different from the ground wiring G.

Second Embodiment

The following describes a second embodiment. The present embodiment is different from the first embodiment in that resonance frequency of the input capacitors IC and the first to fourth Y capacitors Y1-Y4 are defined. The other configurations are the same as those of the first embodiment, and therefore a description of the same configurations will be omitted below.

Figure 5A:
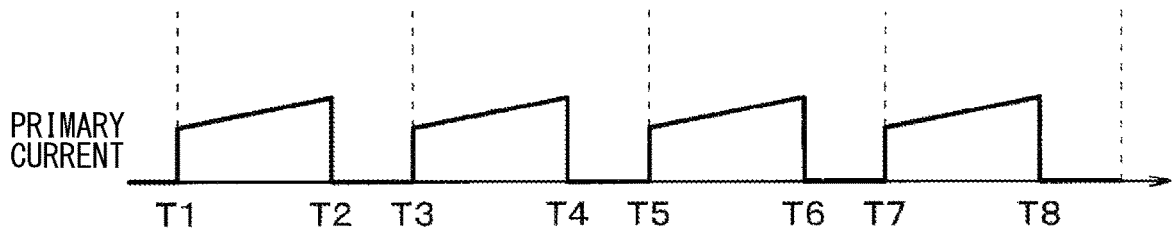
FIG. 5A is a timing chart showing the magnitude of a primary current.

First, in the power conversion device as described above, the primary current flowing through the main wiring P is controlled by turning on and off the first to fourth transistors Q1 to Q4. For example, when the primary current is generated as shown in FIG. 5A, in the first to fourth transistors Q1 to Q4, the first and fourth transistors Q1 and Q4 are turned on and the second and third transistors are turned off at the time point T1. At the time point T2, the second transistor Q2 is turned on and the fourth transistor Q4 is turned off. At the time point T3, the first transistor Q1 is turned off and the third transistor Q3 is turned on. At the time point T4, the fourth transistor Q4 is turned on and the second transistor Q2 is turned off. Then, after the time point T5, on/off states of the first to fourth transistors Q1 to Q4 are controlled as in the time point T1 to the time point 4.

In this case, if the resonance frequency of the input capacitors IC and the first to fourth Y capacitors Y1 to Y4 (hereinafter, also simply referred to as the resonance frequency) is not particularly defined, the noise may increase due to the increase in the resonance current. Here, the cycle from when the first transistors Q1 to Q4 are turned on to when they are turned on next is defined as a switching cycle. In the present embodiment, for example, the period from the time point T1 to the time point T5 is the switching cycle. The switching frequency is indicated by the reciprocal of the switching cycle.

Figure 5B:
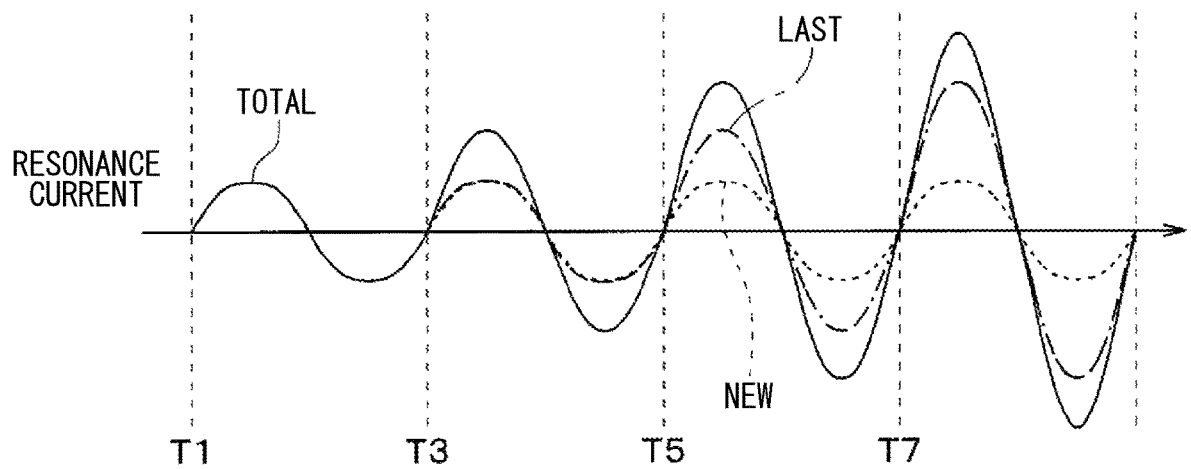
FIG. 5B is a timing chart showing a resonance current in a case where a resonance frequency of input capacitors and Y capacitors is an even multiple of a switching frequency.

In this case, as shown in FIG. 5B, when the resonance frequency is an even multiple of the switching frequency, a new resonance current is generated every time the primary current rises. Then, when the resonance current before the new resonance current is added is defined as a last resonance current and the sum of the last resonance current and the new resonance current is defined as a total resonance current, the total resonance current gradually increases since the total resonance current is added with the new resonance current each time the primary current rises. In FIG. 5B, the total resonance current is shown by a solid line, the new resonance current is shown by a broken line, and the last resonance current is shown by an alternate long and short dash line, which are the same in FIG. 5C described later.

Figure 5C:
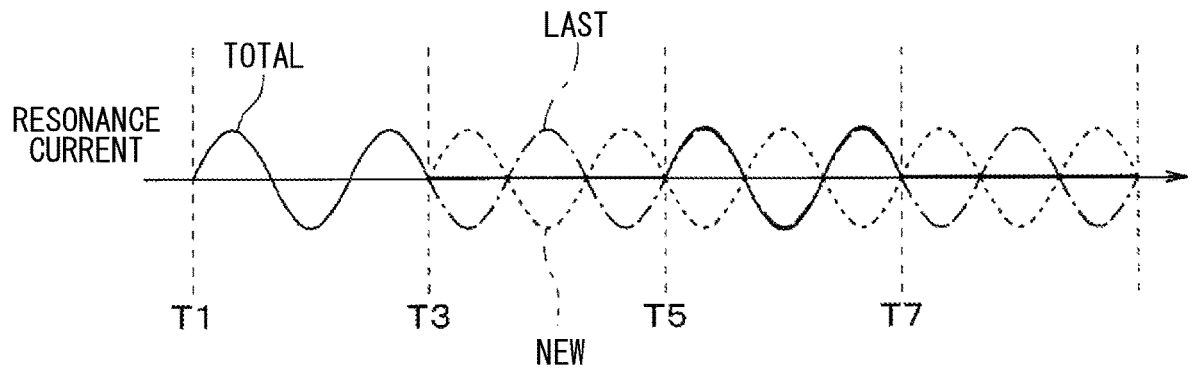
FIG. 5C is a timing chart showing a resonance current in a case where the resonance frequency of the input capacitors and the Y capacitors is an odd multiple of the switching frequency.

On the other hand, as shown in FIG. 5C, even when the resonance frequency is an odd multiple of the switching frequency, the new resonance current is generated every time the primary current rises. However, in this case, the period in which the new resonance current is added to the last resonance current and the period in which the last resonance current and the new resonance current cancel each other occur alternately. Therefore, when the resonance frequency is an odd multiple of the switching frequency, the total resonance current is unlikely to increase.

Therefore, in the present embodiment, the capacitances of the first to fourth Y capacitors Y1 to Y4 are adjusted so that the resonance frequency is an odd multiple of the switching frequency.

According to the present embodiment described above, the first to fourth Y capacitors Y1 to Y4 are disposed so as to face the first to fourth transistors Q1 to Q4, respectively, with the printed circuit board 100 interposed therebetween. The first to fourth semiconductor packages 11 to 14 and the first to fourth Y capacitors Y1 to Y4 are disposed in such a manner that the directions of the electric currents flowing through the first to fourth semiconductor packages 11 to 14 are opposite to the directions of the electric currents flowing through the first to fourth Y capacitors, respectively. Therefore, the same effects as those of the first embodiment can be obtained.

Further, in the present embodiment, the resonance frequency of the input capacitors IC and the first to fourth Y capacitors Y1 to Y4 is an odd multiple of the switching frequency of the first to fourth transistors Q1 to Q4. Therefore, it is possible to suppress an increase in the resonance current, and it is possible to suppress an increase in noise generated due to the superimposition of the resonance current on the primary current.

Third Embodiment

The following describes a third embodiment. The present embodiment is different from the first embodiment in that the lengths of the wirings 111 and 112 formed on the printed circuit board 100 are defined. The other configurations are the same as those of the first embodiment, and therefore a description of the same configurations will be omitted below.

First, in the power conversion device as described above, as shown in FIG. 6, a stray capacitance Cp is formed between the first output wiring L1 and the ground, and first and second common modes currents I1 and I2 flow via the stray capacitance Cp. Specifically, the first common mode current I1 flows through the first transistor Q1 and the first Y capacitor Y1 disposed between the stray capacitance Cp and the ground wiring G. The second common mode current I2 flows through the third transistor Q3 and the third Y capacitor Y3 disposed between the stray capacitance Cp and the ground wiring G. In this case, if the magnitude of the first common mode current I1 and the magnitude of the second common mode current I2 are different, one of them becomes larger and the common mode noise becomes larger.

Therefore, in the present embodiment, the front-surface wiring 111, the rear-surface wiring 112, and the through-hole electrodes 113 in the printed circuit board 100 are formed in such a manner that the sum of the lengths of the wirings 111, 112 and the through-hole electrodes 113 through which the first common mode current I1 flows is equal to the sum of the lengths of the wirings 111, 112 and the through-hole electrodes 113 through which the second common mode current I2 flows.

In other words, the wirings 111 and 112 and the through-hole electrodes 113 that electrically connect between the first output wiring L1 and the insertion hole 114 of the front-surface ground wiring G1 are formed as follows. That is, in the wirings 111 and 112 that electrically connect the first output wiring L1 and the insertion hole 114 of the front-surface ground wiring G1, the sum of the lengths of the wiring 111 and 112 passing through the rear-surface first main wiring P2 and the front-surface first main wiring P1 is equal to the sum of the lengths of the wirings 111 and 112 passing through the rear-surface second main wiring N2 and the front-surface second main wiring N1. That is, the sum of the lengths of the wirings 111 and 112 connected to the first semiconductor package 11 and the first Y capacitor Y1 is equal to the sum of the lengths of the wirings 111 and 112 connected to the third semiconductor package 13 and the third Y capacitor Y3. The through-hole electrodes 113 connecting the front-surface wiring 111 and the rear-surface wiring 112 have the same length.

Here, the sum of the lengths of the wirings 111 and 112 through which the first common mode current I1 flows is the sum of the following lengths. That is, the length of the wiring 111 through which the first common mode current I1 flows includes a length between the insertion hole 114 and a portion connected to the first Y capacitor Y1 in the front-surface ground wiring G1. However, in the present embodiment, the first Y capacitor Y1 includes the three Y capacitors. Therefore, the length between the insertion hole 114 and the portion connected to the first Y capacitor Y1 in the front-surface ground wiring G1 is an average length. The length of the wiring 111 through which the first common mode current I1 flows includes a length between a portion connected to the first Y capacitor Y1 and a portion connected to the through-hole electrodes 113 in the front-surface first main wiring P1. Further, the length of the wiring 112 through which the first common mode current I1 flows includes a length between a portion connected to the first semiconductor package 11 and a portion connected to the through-hole electrodes 113 in the rear-surface first main wiring P2. The length of the wiring 112 through which the first common mode current I1 flows includes a length between a portion connected to the first semiconductor package 11 and the first output wiring L1 in the first electrode wiring E1. The sum of the lengths of the wirings 111 and 112 through which the first common mode current I1 flows is the sum of these lengths.

Similarly, the sum of the lengths of the wirings 111 and 112 through which the second common mode current I2 flows is the sum of the following lengths. That is, the length of the wiring 111 through which the second common mode current I2 flows includes a length between the insertion hole 114 and a portion connected to the third Y capacitor Y3 in the front-surface ground wiring G1. However, in the present embodiment, the third Y capacitor Y3 includes the three Y capacitors. Therefore, the length between the insertion hole 114 and the portion connected to the third Y capacitor Y3 in the front-surface ground wiring G1 is an average length. The length of the wiring 111 through which the second common mode current I2 flows includes a length between a portion connected to the third Y capacitor Y3 and a portion connected to the through-hole electrodes 113 in the front-surface second main wiring N1. Further, the length of the wiring 112 through which the second common mode current I2 flows includes a length between a portion connected to the third semiconductor package 13 and a portion connected to the through-hole electrodes 113 in the rear-surface second main wiring N2. The length of the wiring 112 through which the second common mode current I2 flows includes a length between a portion connected to the third semiconductor package 13 and the first output wiring L1 in the first electrode wiring E1. The sum of the lengths of the wirings 111 and 112 through which the first common mode current I2 flows is the sum of these lengths.

Figure 6:
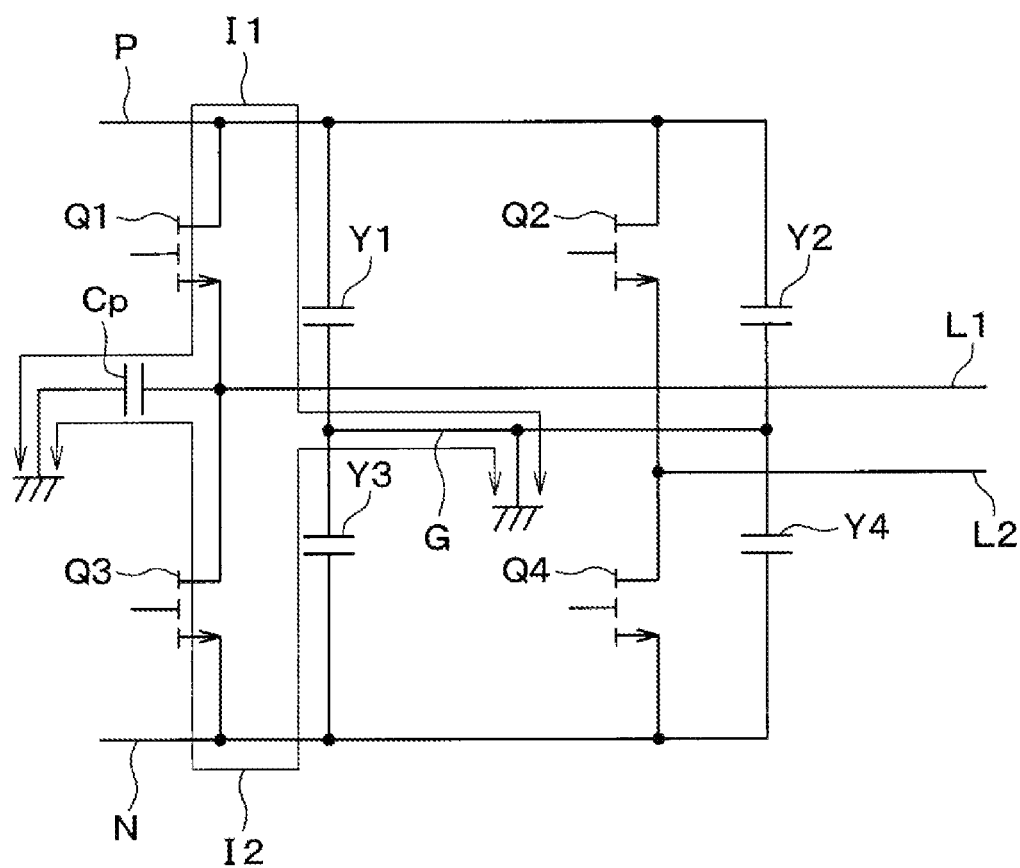
FIG. 6 is a circuit diagram showing a common mode current according to a third embodiment.

Although FIG. 6 shows only the stray capacitance Cp between the first output wiring L1 and the ground, in reality, the stray capacitance Cp is also formed between the second output wiring L2 and the ground. Then, between the stray capacitance Cp and the ground wiring G, a common mode current flows through the second transistor Q2 and the second Y capacitor Y2, and a common mode current flows through the fourth transistor Q4 and the fourth Y capacitor Y4.

Therefore, although not particularly shown, the front-surface wiring 111, the rear-surface wiring 112, and the through-hole electrodes 113 in the printed circuit board 100 are formed as follows in a portion electrically connecting the second output wiring L2 and the through hole 114 in the front-surface ground wiring G1. That is, the sum of the lengths of the wirings 111 and 112 and the through-hole electrodes 113 connected to the second semiconductor package 12 and the second Y capacitor Y2 is equal to the sum of the lengths of the wirings 111 and 112 and the through-hole electrodes 113 connected to the fourth semiconductor package 14 and the fourth Y capacitor Y4.

According to the present embodiment described above, the first to fourth Y capacitors Y1 to Y4 are disposed so as to face the first to fourth transistors Q1 to Q4, respectively, with the printed circuit board 100 interposed therebetween. The first to fourth semiconductor packages 11 to 14 and the first to fourth Y capacitors Y1 to Y4 are disposed in such a manner that the directions of the electric currents flowing through the first to fourth semiconductor packages 11 to 14 are opposite to the directions of the electric currents flowing through the first to fourth Y capacitors, respectively. Therefore, the same effects as those of the first embodiment can be obtained.

Further, in the present embodiment, the wirings 111 and 112 and the through-hole electrodes 113 that electrically connect the first output wiring L1 and the insertion hole 114 of the front-surface ground wiring G1 are formed as follows. That is, the sum of the lengths of the wirings 111 and 112 and the through-hole electrodes 113 connected to the first semiconductor package 11 and the first Y capacitor Y1 is equal to the sum of the lengths of the wirings 111 and 112 and the through-hole electrodes 113 connected to the third semiconductor package 13 and the third Y capacitor Y3. In addition, the sum of the lengths of the wirings 111 and 112 and the through-hole electrodes 113 connected to the second semiconductor package 12 and the second Y capacitor Y2 is equal to the sum of the lengths of the wirings 111 and 112 and the through-hole electrodes 113 connected to the fourth semiconductor package 14 and the fourth Y capacitor Y4. Therefore, the common mode currents flow evenly, it is possible to suppress an increase in the common mode currents, and the effect of suppressing noise can be improved.

Fourth Embodiment

The following describes a fourth embodiment. The present embodiment is different from the first embodiment in position at which the insertion hole is located. The other configurations are the same as those of the first embodiment, and therefore a description of the same configurations will be omitted below.

Figure 7A:
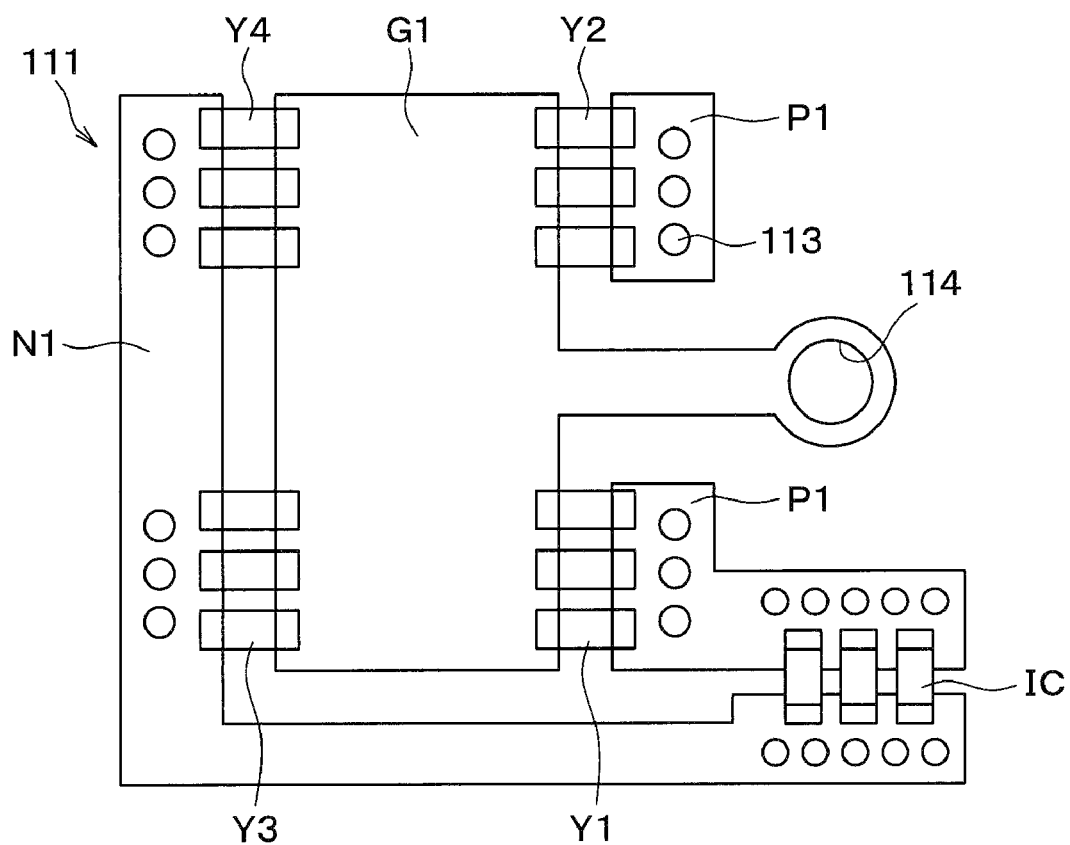
FIG. 7A is a schematic plan view of a front surface side of a printed circuit board according to a fourth embodiment.
Figure 7B:
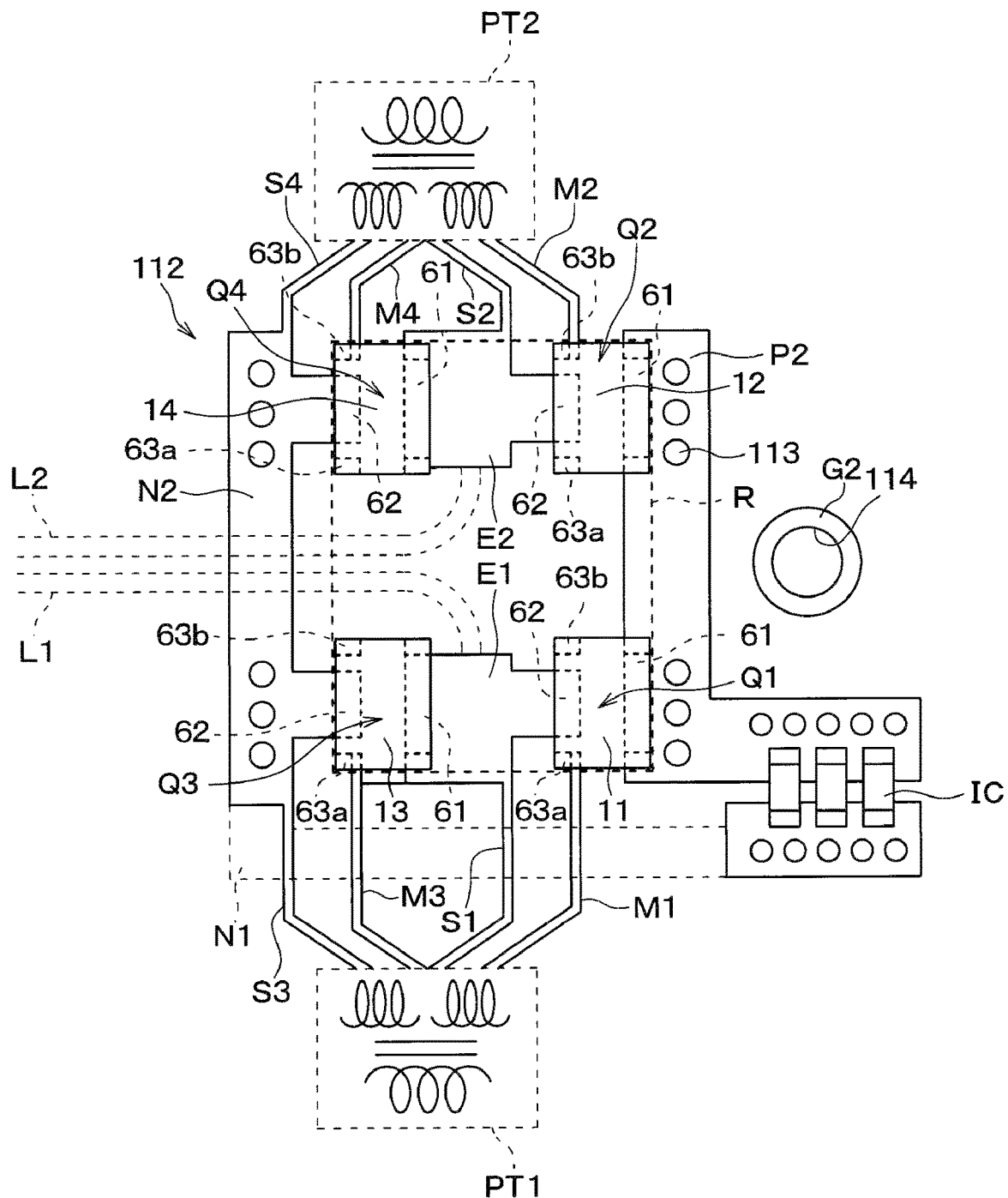
FIG. 7B is a schematic plan view of a rear surface side of the printed circuit board according to the fourth embodiment.

In the printed circuit board 100 of the present embodiment, as shown in FIGS. 7A and 7B, the insertion hole 114 is located outside a region R surrounded by portions at which the first to fourth semiconductor packages 11 to 14 are disposed when viewed from the normal direction. In the first embodiment or the like, the insertion hole 114 is located inside the region R surrounded by the first to fourth semiconductor packages 11 to 14 when viewed from the normal direction.

In the present embodiment, on the front surface 100a of the printed circuit board 100, the insertion hole 114 is located opposite to the front-surface second main wiring N1 with the front-surface first main wiring P1 interposed therebetween. Further, the front-surface first main wiring P1 is divided into two portions disposed in the extending direction. The front-surface ground wiring G1 is extended to the insertion hole 114 through between the two portions of the front-surface first main wirings P1 disposed in the extending direction, and is also formed around the insertion hole 114. The portions where the front-surface first main wiring P1 is divided are electrically connected via the through-hole electrodes 113 and the rear-surface first main wiring P2.

Since the insertion hole 114 is located as described above, on the rear surface 100b of the printed circuit board 100, the insertion hole 114 is located opposite to the rear-surface second main wiring N2 with the rear-surface first main wiring P2 interposed therebetween.

Further, in the present embodiment, since the insertion hole 114 is located outside the region R as compared with the first embodiment, the first electrode wiring E1 and the second electrode wiring E2 are configured as follows. That is, as compared with the first embodiment, the length of the portion of the first electrode wiring E1 connecting the first semiconductor package 11 and the third semiconductor package 13 is shortened. Further, as compared with the first embodiment, the length of the portion of the second electrode wiring E2 connecting the second semiconductor package 12 and the fourth semiconductor package 14 is shortened.

According to the present embodiment described above, the first to fourth Y capacitors Y1 to Y4 are disposed so as to face the first to fourth transistors Q1 to Q4, respectively, with the printed circuit board 100 interposed therebetween. The first to fourth semiconductor packages 11 to 14 and the first to fourth Y capacitors Y1 to Y4 are disposed in such a manner that the directions of the electric currents flowing through the first to fourth semiconductor packages 11 to 14 are opposite to the directions of the electric currents flowing through the first to fourth Y capacitors, respectively. Therefore, the same effects as those of the first embodiment can be obtained.

Further, in the present embodiment, on the front surface 100a of the printed circuit board 100, the insertion hole 114 is located outside the region R surrounded by the first to fourth semiconductor packages 11 to 14. Therefore, as compared with the case where the insertion hole 114 is located inside the region R surrounded by the first to fourth semiconductor packages 11 to 14, the following effects can be obtained. That is, the length of the portion of the first electrode wiring E1 connecting the first semiconductor package 11 and the third semiconductor package 13 can be easily shortened, and the length of the portion of the second electrode wiring E2 connecting the second semiconductor package 12 and the fourth semiconductor package 14 can be easily shortened. Therefore, it becomes easy to shorten the length of the wiring connecting the upper arm element and the lower arm element in each leg, and the switching surge can be reduced by reducing the parasitic inductance.

The present embodiment shows the example in which, on the front surface 100a of printed circuit board 100, the insertion hole 114 is located opposite to the front-surface second main wiring N1 with the front-surface first main wiring P1 interposed therebetween, but the position of the insertion hole 114 can be changed as appropriate. For example, the insertion hole 114 may be located opposite to the front-surface ground wiring G1 with the front-surface second main wiring N1 interposed therebetween. In another example, on the rear surface 100b of the printed circuit board 100, the insertion hole 114 may be located opposite to the first and third semiconductor packages 11 and 13 with the second and fourth semiconductor packages 12 and 14 interposed therebetween. Similarly, on the rear surface 100*b* of the printed circuit board 100, the insertion hole 114 may be located opposite to the second and fourth semiconductor packages 12 and 14 with the first and third semiconductor packages 11 and 13 interposed therebetween. Further, two or more insertion holes 114 may be provided instead of one.

Other Embodiments

Although the present disclosure has been described in accordance with the embodiments, it is understood that the present disclosure is not limited to such embodiments or structures. The present disclosure encompasses various modifications and variations within the scope of equivalents. In addition, while the various elements are shown in various combinations and configurations, which are exemplary, other combinations and configurations, including more, less or only a single element, are also within the spirit and scope of the present disclosure.

In each of the above embodiments, in the first to fourth semiconductor packages 11 to 14, a resin member may be disposed between the rear surface electrode 34 of the semiconductor chip 30 and the connection wiring 21, and the rear surface electrode 34 and connection wiring 21 may be electrically connected via a through electrode formed in the resin member.

In each of the above embodiments, the switching element formed on the semiconductor chip 30 can be appropriately changed, and an IGBT (Insulated Gate Bipolar Transistor) element or the like may be formed as the switching element. Further, the switching element formed on the semiconductor chip 30 may be a vertical switching element in which a current flows in the thickness direction of the semiconductor substrate 33.

In each of the above embodiments, the semiconductor substrate 33 in the semiconductor chip 30 may be composed only of the silicon substrate 31 or may be composed of only the semiconductor layer 32 containing gallium nitride. Further, the semiconductor substrate 33 may be configured using a silicon carbide substrate, or may be configured using another compound semiconductor substrate.

In each of the above embodiments, each of the first to fourth Y capacitors Y1 to Y4 may include multiple capacitors connected in series. Accordingly, even if a part of the capacitors connected in series fails, a short circuit can be suppressed by the other part of the capacitors, and the durability can be improved.

In the above embodiments, an example has been described in which the gate pads 63 in each of the first to fourth semiconductor packages 11 to 14 include the first gate pad 63*a* and the second gate pad 63*b*. However, the number of gate pad 63 in each of the first to fourth semiconductor packages 11 to 14 may be only one. In this case, the shape of the wiring on the printed circuit board 100 may be adjusted. The first to fourth semiconductor packages 11 to 14 do not have to have the same configuration, and a part of the first to fourth semiconductor packages 11 to 14 may have a different configuration. For example, a part of the first to fourth semiconductor packages 11 to 14 may have a configuration including the first gate pad 63*a* and the second gate pad 63*b*, and the other part of the first to fourth semiconductor packages 11 to 14 may have a configuration without the second gate pad 63*b*.

In each of the above embodiments, the input capacitor IC may be disposed on only one of the front surface 100*a* and the rear surface 100*b* of the printed circuit board 100. In another example, the input capacitor IC may be provided in a member different from the printed circuit board 100, and may be provided when the power conversion device is configured by using the semiconductor module.

In the second embodiment, the first to fourth Y capacitors Y1 to Y4 may be configured such that the resonance frequency with the input capacitors IC is an even multiple of the switching frequency.

Further, the above embodiments may be combined together as appropriate. For example, the second embodiment may be combined with the third or fourth embodiments to adjust the resonance frequency of the first to fourth Y capacitors Y1 to Y4. The third embodiment may be combined with the fourth embodiment to adjust the lengths of the wirings 111 and 112. The combinations of each embodiment may be further combined.

What is claimed is:

1. A semiconductor module comprising:
   a substrate having a front surface, a rear surface opposite to the front surface, a front-surface wiring disposed on the front surface, and a rear-surface wiring disposed on the rear surface;
   at least one semiconductor package including a semiconductor chip and a pad electrically connected to the semiconductor chip, the semiconductor chip including a switching element, the at least one semiconductor package disposed to the substrate in a state where the pad is electrically connected to the rear-surface wiring;
   a housing to which the substrate is fixed in a state where the at least one semiconductor package is thermally connected to the housing; and
   at least one Y capacitor, wherein
   the front-surface wiring includes a front-surface ground wiring electrically connected to the housing, and a front-surface main wiring electrically connected to the rear-surface wiring that is electrically connected to the at least one semiconductor package,
   the at least one Y capacitor is disposed on the front surface of the substrate at a position facing the at least one semiconductor package and between the front-surface ground wiring and the front-surface main wiring, and
   the at least one semiconductor package and the at least one Y capacitor are disposed in such a manner that a direction of electric current flowing in the at least one semiconductor package and a direction of electric current flowing in the at least one Y capacitor are opposite to each other.

2. The semiconductor module according to claim 1, wherein
   the at least one semiconductor package further includes a through electrode, and
   the semiconductor chip and the pad are electrically connected via the through electrode.

3. The semiconductor module according to claim 1, wherein
   the semiconductor chip is formed of a semiconductor substrate in which a lateral switching element as the switching element is formed, and
   the lateral switching element allows a flow of electric current in a plane direction of the semiconductor substrate.

4. The semiconductor module according to claim 3, wherein the semiconductor substrate in the semiconductor chip includes a silicon substrate and a semiconductor layer laminated on the silicon substrate, and the semiconductor layer contains gallium nitride.

5. The semiconductor module according to claim 1, wherein the semiconductor package further includes an electrically insulating heat dissipation substrate having a front surface and a rear surface opposite to the front surface, the semiconductor chip is disposed to the front surface of the electrically insulating heat dissipation substrate, and the rear surface of the electrically insulating heat dissipation substrate is electrically insulated from the semiconductor chip and is thermally connected to the housing.

6. The semiconductor module according to claim 5, wherein the at least one semiconductor package further includes a heat dissipation member disposed between the rear surface of the electrically insulating heat dissipation substrate and the housing.

7. The semiconductor module according to claim 1, wherein the at least one Y capacitor includes a plurality of chip capacitors electrically connected in parallel or electrically connected in series.

8. The semiconductor module according to claim 1, further comprising an input capacitor disposed in parallel with the switching element and the at least one Y capacitor, wherein the at least one Y capacitor is configured such that a resonance frequency with the input capacitor is an odd multiple of a switching frequency of the switching element.

9. The semiconductor module according to claim 1, wherein the pad in the at least one semiconductor package includes a first pad, a second pad, and a gate pad to which a voltage for controlling electric current flowing between the first pad and the second pad is applied, the front-surface main wiring includes a front-surface first main wiring and a front-surface second main wiring, the rear-surface wiring includes a gate connection wiring electrically connected to the gate pad, and an electrode wiring electrically connected to the first pad or the second pad, the substrate further includes an output wiring electrically connected to the electrode wiring, the output wiring and the gate connection wiring are drawn out in opposite directions when viewed from a normal direction with respect to the front surface of the substrate, and the gate connection wiring overlaps with the front-surface first main wiring or the front-surface second main wiring in the normal direction with respect to the front surface of the substrate and is orthogonal to the front-surface first main wiring or the front-surface second main wiring with which the gate connection wiring overlap.

10. The semiconductor module according to claim 1, further comprising a fastening member, wherein the substrate has an insertion hole that penetrates through the substrate in a portion where the front-surface ground wiring is disposed, the fastening member is disposed in the insertion hole to fasten the substrate to the housing, and the front-surface ground wiring is electrically connected to the housing via the fastening member.

11. The semiconductor module according to claim 10, wherein the front-surface main wiring includes a front-surface first main wiring and a front-surface second main wiring, the rear-surface wiring includes a rear-surface first main wiring, a rear-surface second main wiring, and an electrode wiring, the rear-surface first main wiring is disposed at a position facing the front-surface first main wiring and is electrically connected to the front-surface first main wiring, the rear-surface second main wiring is disposed at a position facing the front-surface second main wiring and is electrically connected to the rear-surface second main wiring, the substrate further includes an output wiring electrically connected to the electrode wiring, the at least one semiconductor package includes a plurality of semiconductor packages, one of the plurality of semiconductor packages is disposed between the rear-surface first main wiring and the electrode wiring, and a different one of the plurality of semiconductor packages is disposed between the rear-surface second main wiring and the electrode wiring, the at least one Y capacitor includes a plurality of Y capacitors, one of the plurality of Y capacitors is disposed on the front surface of the substrate at a position facing the one of the plurality of semiconductor packages and between the front-surface first main wiring and the front-surface ground wiring, and a different one of the plurality of Y capacitors is disposed on the front surface of the substrate at a position facing the different one of the plurality of semiconductor packages and between the front-surface second main wiring and the front-surface ground wiring, and in the front-surface wiring and the rear-surface wiring electrically connecting the output wiring and the insertion hole formed in the front-surface ground wiring, a sum of lengths of the rear-surface first main wiring and the front-surface main wiring is equal to a sum of lengths of the rear-surface second main wiring and the front-surface second main wiring.

12. The semiconductor module according to claim 10, wherein the at least one semiconductor package includes a plurality of semiconductor packages, and when viewed from the normal direction with respect to the front surface of the substrate, the insertion hole is located outside a region surrounded by a plurality of portions where the plurality of semiconductor packages is disposed, respectively.

* * * * *